United States Patent
Underwood et al.

(10) Patent No.: US 11,664,570 B2
(45) Date of Patent: May 30, 2023

(54) FLUX-TUNABLE QUBIT ARCHITECTURE FOR MULTIPLEXING QUBIT CONTROL LINES

(71) Applicant: INTERNATIONAL BUSINESS MACHINES CORPORATION, Armonk, NY (US)

(72) Inventors: Devin Underwood, Bronx, NY (US); Jiri Stehlik, New York, NY (US); David Zajac, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 311 days.

(21) Appl. No.: 17/000,183

(22) Filed: Aug. 21, 2020

(65) Prior Publication Data
US 2022/0059919 A1 Feb. 24, 2022

(51) Int. Cl.
*H01P 5/16* (2006.01)
*G06N 10/00* (2022.01)
*H10N 69/00* (2023.01)

(52) U.S. Cl.
CPC ............ *H01P 5/16* (2013.01); *G06N 10/00* (2019.01); *H10N 69/00* (2023.02)

(58) Field of Classification Search
CPC .......... H01P 5/16; G06N 10/00; G06N 10/80; G06N 10/60; G06N 10/40; G06N 10/70; G06N 10/20; H01L 27/18; H01L 25/16; H01L 25/162; H01L 25/165; H01L 25/167; H01L 25/18; H10N 69/00
See application file for complete search history.

(56) References Cited

U.S. PATENT DOCUMENTS

| 7,498,832 B2 | 3/2009 | Baumgardner et al. |
| 8,022,722 B1 | 9/2011 | Pesetski et al. |
| 8,242,799 B2 * | 8/2012 | Pesetski ................. B82Y 10/00 326/1 |
| 9,438,246 B1 * | 9/2016 | Naaman ................. G06N 10/00 |
| 9,685,935 B2 | 6/2017 | Strand et al. |

(Continued)

FOREIGN PATENT DOCUMENTS

| WO | 2018/062991 A1 | 4/2018 |
| WO | 20182369221 A1 | 12/2018 |

OTHER PUBLICATIONS

Fowler, A. G. et al., "Surface Codes: Towards Practical Large-Scale Quantum Computation"; PACS (2012); 54 pgs.

(Continued)

*Primary Examiner* — Metasebia T Retebo
(74) *Attorney, Agent, or Firm* — Intelletek Law Group, PLLC; Gabriel Daniel, Esq.

(57) ABSTRACT

A method of multiplexing control lines of a qubit array includes applying a qubit control signal to a single driveline. The qubit control signal is split on the single driveline between a first resonator and a second resonator. The first driveline is operative to control a first qubit, a second tunable qubit, a third qubit, and a fourth tunable qubit. The first qubit is coupled to the second tunable qubit by the first resonator. The third qubit is coupled to the fourth tunable qubit by the second resonator. A variation in amplitude of the qubit control signal is compensated by adjusting a frequency of the second tunable qubit and a frequency of the fourth tunable qubit.

20 Claims, 16 Drawing Sheets

(56) References Cited

U.S. PATENT DOCUMENTS

| | | | |
|---|---|---|---|
| 10,164,606 B1 * | 12/2018 | Keane | H03K 17/92 |
| 10,353,844 B2 | 7/2019 | Naaman et al. | |
| 2018/0330267 A1 | 11/2018 | Rigetti et al. | |
| 2019/0044668 A1 | 2/2019 | Elsherbini et al. | |

OTHER PUBLICATIONS

Paik, H. et al., "Experimental Demonstration of a Resonator-Induced Phase Gate in a Multi-Qubit Circuit QED System"; arXiv:1606.00685v1 [quant-ph] (2016); 13 pgs.

Li, R. et al., "A Crossbar Network for Silicon Quantum Dot Qubits"; Sci. Adv. (2018); vol. 4; eaar3960 (10 pgs).

George, R. E. et al., "Multiplexing Superconducting Qubit Circuit for Single Microwave Photon Generation"; arXiv:1609.07057v1 [quant-ph] (2016); 16 pgs.

McKay, D.C. et al., "A Universal Gate for Fixed-Frequency Qubits via a Tunable Bus"; Phys. Rev. Applied (2016); 10 pgs.

Paik, H. et al., "Experimental Demonstration of a Resonator-Induced Phase Gate in a Multi-Qubit QED System"; arXiv.org (2016); 13 pgs.

Moein, M. et al., "Optimization of the Resonator-Induced Phase Gate for Superconducting Qubits"; arXiv.org (2021); 34 pgs.

Krantz, P. et al., "A Quantum Engineer's Guide to Superconducting Qubits"; arXiv.org (2019); 66 pgs.

Stehlik, J. et al., "Tunable Coupling Architecture for Fixed-Frequency Transmons"; arXiv.org (2021); 7 pgs.

International Search Report and Written Opinion dated Dec. 3, 2021 in related international application PCT/EP2021/072978; 16 pgs.

* cited by examiner

1. PULSE TUNABLE QUBIT TO FREQUENCY THAT COMPENSATES FOR DISORDER
2. APPLY RIP PULSE TO PERFORM TWO-QUBIT GATE

MULTI-PLEXED RIP BUS DRIVES: 3RD ENTANGLING GATE

FLUX-TUNABLE QUBIT ARCHITECTURE FOR MULTIPLEXING QUBIT CONTROL LINES

BACKGROUND

Technical Field

The present disclosure generally relates to superconducting devices, and more particularly, to qubit control.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state. Various quantum phenomena, such as superposition and entanglement, do not have analogs in the world of classical computing and therefore may involve special structures, techniques, and materials.

SUMMARY

According to various embodiments, a method and system are provided for multiplexing control lines of a qubit array. A qubit control signal is applied to a single driveline. The qubit control signal on the single driveline is split between a first resonator and a second resonator, wherein the first driveline is operative to control a first qubit, a second tunable qubit, a third qubit, and a fourth tunable qubit. The first qubit is coupled to the second tunable qubit by the first resonator. The third qubit is coupled to the fourth tunable qubit by the second resonator. A variation in amplitude of the qubit control signal is compensated for by adjusting a frequency of the second tunable qubit and/or a frequency of the fourth tunable qubit. A disorder may be, without limitation, a variation in the first qubit's frequency and/or a variation in a pulse amplitude.

In one embodiment, the control line is configured to drive a resonator induced phase (RIP) gate, the first resonator is a RIP resonator, and the second resonator is a RIP resonator.

In one embodiment, a calibration of the RIP gate between the first qubit and the second qubit is provided by maximizing a fidelity of the gate while varying a RIP frequency.

In one embodiment, the second and fourth tunable qubits are flux-tunable Ancilla qubits operative to modify a frequency difference between the corresponding RIP resonator by changing a quantum state dependent frequency shift $\chi$ on the corresponding RIP resonator of the first and second RIP resonators. The frequency of the RIP resonator may depend on the quantum states, the Ancilla and the Data qubit. If both qubits are in a ground state then the frequency of the RIP resonator will not shift. If one, or both qubits are in the excited state, the RIP resonator frequency will shift by $\chi$.

The magnitude of the $\chi$ shift depends on the frequency different between the Ancilla qubit and the RIP resonator.

In one embodiment, a magnitude of the frequency shift $\chi$ of the first qubit and second tunable qubit depends on a frequency difference between the second tunable qubit and the first qubit.

In one embodiment, a second variation in amplitude of the qubit control signal is compensated for by adjusting a frequency of the fourth tunable qubit.

In one embodiment, the qubit control signal is a radio frequency (RF) pulse having a fixed drive amplitude and a fixed frequency.

In one embodiment, the splitting is performed by a resistive power splitter, a reactive power splitter, or a multi-port coupler.

In one embodiment, the splitting is performed by a Wilkinson resistive power splitter, a Wye power splitter, or a Delta power splitter.

In one embodiment, error correction is performed for a surface code architecture by cyclically performing at least one of X-parity and Z-parity.

In one embodiment, the first resonator is detuned from the second resonator. A drive frequency of the qubit control signal is moved to a frequency where a gate rate for the first qubit and the second tunable qubit is same as a gate rate for the third qubit and the tunable fourth qubit.

According to one embodiment, a quantum structure includes a first qubit, a second tunable qubit coupled to the first qubit via a first resonator, a third qubit, a fourth tunable qubit coupled to the third qubit via a second resonator, and a fixed driveline coupled to the first resonator and the second resonator. The second tunable qubit is configured to be adjusted to compensate for a variation in amplitude of a qubit control signal of the fixed driveline.

In one embodiment, the control line carries signals to a resonator to drive a resonator induced phase (RIP) gate. The first resonator is a RIP resonator. The second resonator is a RIP resonator.

In one embodiment, the second and fourth tunable qubits are flux-tunable Ancilla qubits configured to modify a quantum state dependent frequency shift $\chi$ of its corresponding RIP resonator.

In one embodiment, a modification of $\chi$ of at least one of the first or third resonators is operative to mitigate a disorder in a pulse amplitude of the qubit control signal.

In one embodiment, an adjustment of a frequency of the fourth tunable qubit is operative to compensate for a second variation in amplitude of the qubit control signal.

In one embodiment, the qubit control signal is a radio frequency (RF) pulse having a fixed drive amplitude and a fixed frequency.

In one embodiment, the splitting is performed by a resistive power splitter, a reactive power splitter, or a multi-port coupler.

In one embodiment, there is an RF splitter configured to split a qubit control signal on the fixed single driveline.

According to one embodiment, a quantum structure includes a first qubit, a second tunable qubit coupled to the first qubit via a first resonator, a third qubit, a fourth tunable qubit coupled to the third qubit via a second resonator, and a shared driveline coupled to the first resonator and the second resonator. The first resonator is detuned from the second resonator. A drive frequency of a qubit control signal is at a frequency where a gate rate for the first qubit and the second tunable qubit is same as a gate rate for the third qubit and the tunable fourth qubit. The detuning of the first resonator from the second resonator can be performed by way of fabricating the resonators with different dimensions.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1A:
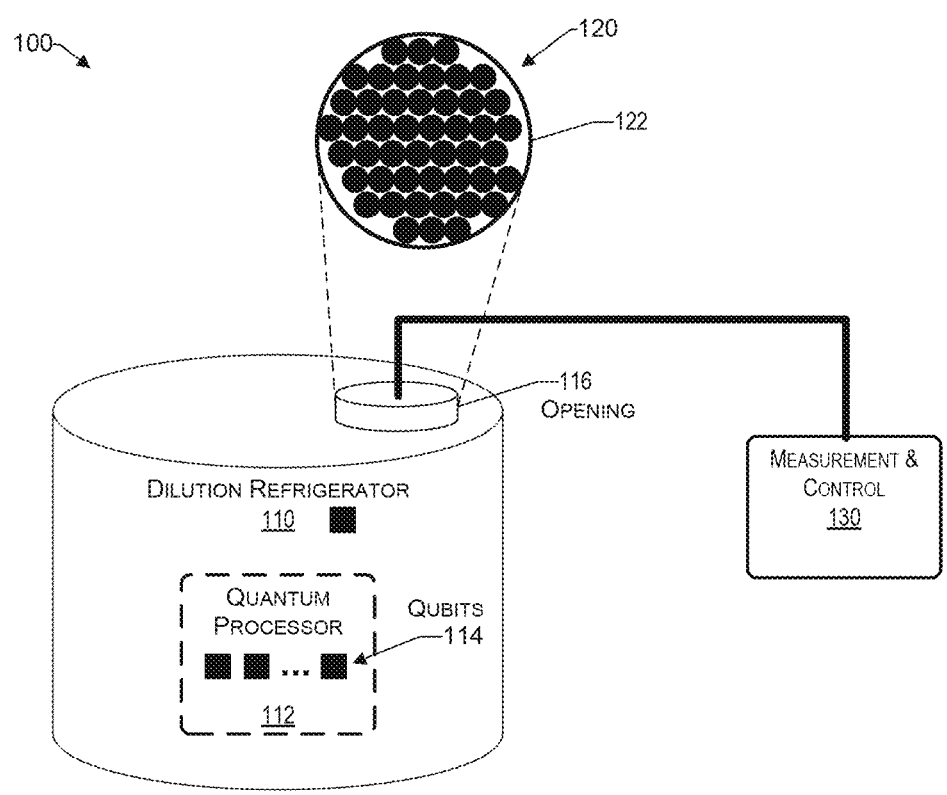
FIG. 1A illustrates an example architecture of a quantum computing system, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In discussing the present technology, it may be helpful to describe various salient terms. As used herein a qubit represents a quantum bit and a quantum gate is an operation performed on a qubit, such as controlling the super-positioning between two qubits.

As used herein, a resonator-induced phase (RIP) gate is a multi-qubit entangling gate. It allows a high degree of flexibility in qubit frequencies, making it appropriate for quantum operations in large-scale architectures. An advantage of the RIP gate is its ability to couple qubits even if they are substantially detuned from each other. Accordingly, a RIP gate can overcome challenges due to constraints on the frequency arrangements of the qubits that may hinder scalability towards larger quantum architectures. The RIP gate is a CZ gate that uses the strong coupling between qubits and a resonator in a quantum system. It can be realized by applying a detuned pulsed microwave drive to a shared bus cavity.

As used herein, the term C-phase relates to a controlled phase gate, where a Z rotation of one qubit is defined by the state of another qubit. A ZZ refers to a state dependent qubit interaction that can be used to form a C-phase gate.

As used herein, the term flux-tunable relates to a device whose frequency depends on magnetic flux.

As used herein, an ancilla qubit relates to a quantum bit that can be used in error correcting protocols to store entangled quantum states. Ancilla can be used in a parity circuit to extract the parity of an entangled state. A parity circuit relates to a quantum circuit used for determining the parity of an entangled state of data qubits.

As used herein, a transmon is type of superconducting qubit, in which the charging energy Ec is much smaller than the Josephson energy Ej.

As used herein, a driveline relates to a qubit control line that carries signals to the qubit. The term multiplexing includes the meaning of a single control line capable of carrying signals for multiple qubits.

Although the terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

The present disclosure generally relates to superconducting devices, and more particularly, efficient interaction with a lattice array comprising a plurality of qubits. The electromagnetic energy associated with a qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. Alternatively, or in addition, a microwave signal (e.g., pulse) can be used to entangle one or more qubits. Much of the process is performed in a cold environment (e.g., in a cryogenic chamber), while the microwave signal of a qubit is ultimately measured at room temperature. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs), such as Josephson amplifiers and travelling-wave parametric amplifiers (TWPAs), may be used as preamplifiers (i.e., first amplification stage) at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

A qubit system may include one or more readout resonators coupled to the qubit. A readout resonator may be a transmission line that includes a capacitive connection to ground on one side and is either shorted to the ground on the other side, such as for a quarter wavelength resonator, or may have a capacitive connection to ground, such as for a half wavelength resonator, which results in oscillations within the transmission line, with the resonant frequency of the oscillations being close to the frequency of the qubit. For example, the readout resonator affects a pulse coming from the control/measurement instruments at the readout resonator frequency. The pulse acts as a measurement that decoheres the qubit and makes it collapse into a state of "one" or "zero," thereby imparting a phase shift on that measurement pulse.

Between qubits there may be a coupling resonator, sometimes referred to herein as a coupler resonator or RIP bus, which allows coupling different qubits together in order to realize quantum logic gates. The coupling resonator is typically structurally similar to the readout resonator. However, more complex designs are possible. When a qubit is implemented as a transmon, each side of the coupling resonator is coupled (e.g., capacitively or inductively) to a corresponding qubit by being in adequate proximity to (e.g., the capacitor of) the qubit. Since each side of the coupling resonator has coupling with a respective different qubit, the two qubits are coupled together through the coupling resonator (e.g., RIP bus). In this way, there is mutual interdependence in the state between coupled qubits, thereby allowing a coupling resonator to use the state of one qubit to control the state of another qubit. Entanglement occurs when the interaction between two qubits is such that the states of the two cannot be specified independently, but can only be specified for the whole system. In this way, the states of two qubits are linked together such that a measurement of one of the qubits, causes the state of the other qubit to collapse.

The ability to include more qubits is salient to being able to realize the potential of quantum computers. Generally, performance increases as temperature is lowered, for example by reducing the residual thermally-excited state qubit population and decreasing the thermal broadening of the qubit transition frequencies. Accordingly, the lower the temperature, the better for a quantum processor.

It has been determined that to increase the computational power and reliability of a quantum computer, improvements are needed along two main dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit.

In one aspect, the teachings herein are based on Applicants' insight that directly applying conventional integrated circuit techniques for interacting with computing elements to superconducting quantum circuits may not be effective because of the unique challenges presented by quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits.

Example Architecture

FIG. 1A illustrates an example architecture 100 of a quantum computing system, consistent with an illustrative embodiment. The architecture 100 includes a quantum processor 112 comprising a plurality of qubits 114. The quantum processor 112 is located in a refrigeration unit 110, which may be a dilution refrigerator. A dilution refrigerator is a cryogenic device that provides continuous cooling to temperatures typically in and around 10 mK. Most of the physical volume of the architecture 100 is due to the large size of the refrigeration unit 110. To reach the near-absolute zero temperatures at which the system operates, the refrigeration unit 110 may use liquid helium as a coolant.

There is a measurement and control unit 130 that is outside of the refrigeration unit 110. The measurement and control unit 130 is able to communicate with the quantum processor through an opening 116, sometimes referred to as a bulkhead of the dilution refrigerator 110, that also forms a hermetic seal separating the ambient atmospheric pressure from the vacuum pressure of the cryostat under operation. A practical challenge in known refrigeration devices that house qubits 114 is that the number of qubits that can be accommodated in the refrigeration unit is limited due the number of wires between the measurement and control unit 130 and the qubits 114 measured/controlled thereby.

As the number of qubits 114 increases, for example to hundreds, thousands, or more, the opening 116 may not be large enough to accommodate all the lines 120 supporting the quantum processor 112 in the dilution refrigerator 110. Stated differently, access to the vacuum environment of the dilution refrigerator 110 is limited to the number of connectors that can fit through the bulkhead opening 116. Known architectures, where a bus is driven to produce two qubit gates, typically involve a factor of two more control lines than the cross-resonance gate discussed herein, thereby making higher scaling impractical.

Accordingly, in one aspect, what is provided herein is an architecture that substantially reduces the number of lines between a measurement and control unit 130 and a quantum processor 112 that is housed in a refrigerated environment. Multiple qubits 114 of the quantum processor 112 can be accessed by way of multiplexing drivelines, which reduces the number of qubit control lines to perform an error correction protocol. The concepts discussed herein provide an architecture and method that minimizes the number of drivelines used to control a quantum processor 112. In one aspect, two qubits are coupled together by a resonator. Driving the resonator with an RF pulse drives a two qubit C-phase gate. One of those two qubits is flux tunable, which facilitates adjustment of the qubit frequency and aligns the frequency with a radio frequency (RF) pulse that drives the two-qubit gate.

Figure 1B:
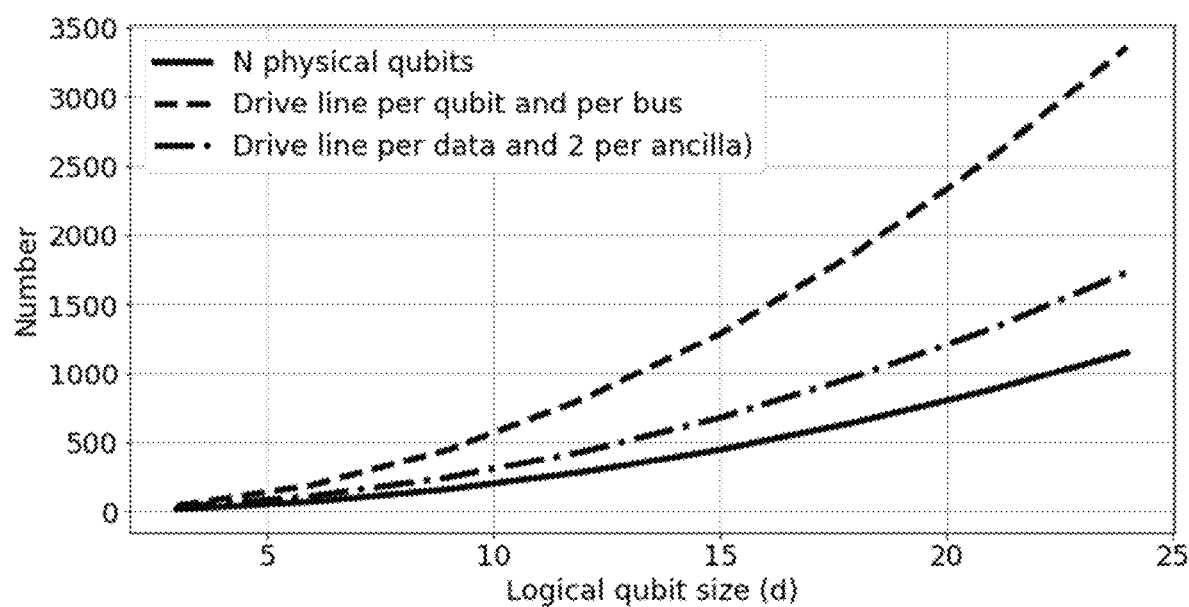
FIG. 1B provides an example graphical representation of a number of wires used in a quantum system with respect to a logical qubit size, consistent with and illustrative embodiment.

As mentioned above, the teachings herein facilitate a substantial reduction in the number of wires that are used between a refrigerated environment 110 and measurement and control equipment 130. In this regard FIG. 1B provides an example graphical representation of the number of wires used in a quantum system with respect to a logical qubit size, consistent with and illustrative embodiment. A disadvantage of an architecture where the bus involves a drive tone (e.g., such as RIP) is that there is an extra driveline used for each bus, represented by the dashed line in FIG. 1B. For example, the number of bus lines for a distance d surface code is provided by the equation below:

$$N_{bus\ lines} = 4d^2 - 4d \quad \text{(Eq. 1)}$$

Accordingly, for a 1000 qubit system d~23, the total number of lines is >3000 for traditional systems. In contrast, by using an ancilla based on the teachings herein, although an additional line is provided for tunability, there are only 4 total RIP lines, represented by the dashed-dot line in FIG. 1B.

In one embodiment, the calculations for a number of RIP lines is based on the size of logical qubit d. The following expressions provide some relationships for different parameters:

The number of physical qubits is:

$$N_{Physical\ Q} = 2d^2 - 1 \quad \text{(Eq. 2)}$$

The number of ancilla qubits is:

$$N_{Ancilla\ Q} = d^2 - 1 \quad \text{(Eq. 3)}$$

The number of data qubits is:

$$N_{Data\ Q} = d^2 \quad \text{(Eq. 4)}$$

The number of bus connections is:

$$N_{Bus} = 4d^2 - 4d \quad \text{(Eq. 5)}$$

There are substantially more bus connections and each bus involves its own RIP drive line. In this example architecture, the total number of bus connections is reduced to 4. However, the number of ancilla drive lines is increased by a factor of 2. Each ancilla qubit involves a single qubit RF drive line, and it involves a drive line for flux tuning. There are significantly more bus connections that than there are Ancilla qubits.

The number of after multiplexing drive lines is:

$$N_{Drive\ Lines} = N_{Data\ Q} + 2N_{Ancilla\ Q} + 4 = 3d^2 + 2 \quad \text{(Eq. 6)}$$

Thus, even after doubling the number of ancilla lines, we still have fewer drive lines than a case where there is one drive-line per bus. By virtue of using the teachings herein, there is one driveline per qubit, represented by the solid line in FIG. 1B, thereby substantially reducing the number of lines to the refrigerated environment.

In one aspect, the concepts discussed herein are scalable in that the architecture allows the splitting of the RF tone, sometimes referred to herein as the flux pulse or the qubit control signal, and driving multiple resonators with the same RF tone. The variation in the RF tone can be mitigated by adjusting the flux tunable qubit frequency. These concepts are discussed in more detail below.

Example Basic Elements

Figure 2:
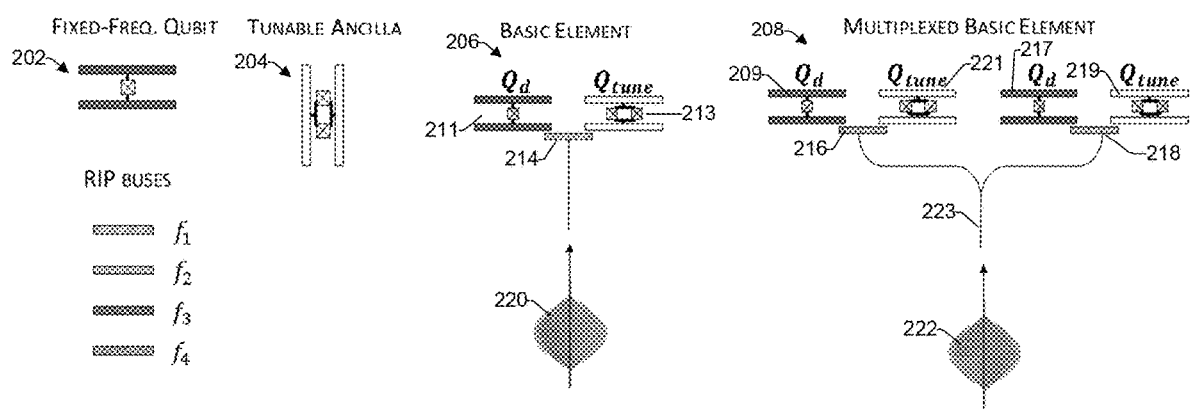
FIG. 2 illustrates basic elements of a flux-tunable qubit architecture, consistent with illustrative embodiments.

Reference now is made to FIG. 2, which illustrates basic elements of a flux-tunable qubit architecture, consistent with illustrative embodiments. In particular, FIG. 2 illustrates a fixed frequency qubit 202 as well as a tunable ancilla qubit 204, sometimes referred to herein simply as a tunable qubit. FIG. 2 also illustrates a basic flux-tunable qubit element 206 comprising a fixed frequency qubit $Q_d$ 211 and a tunable ancilla $Q_{tune}$ 213, which are coupled together by a RIP bus 214 having a first frequency $f_1$. The first qubit $Q_d$ and the second tunable qubit $Q_{tune}$ can be entangled by a pulse 220. For example, a fixed frequency RIP (e.g., radio frequency (RF)) pulse 220 can drive a two-qubit gate by way of the fixed frequency qubit $Q_d$ (211) and the tunable qubit $Q_{tune}$ (213) via the RIP bus 214 having a first frequency $f_1$. In this way, first qubit $Q_d$ 211 and the second tunable qubit $Q_{tune}$ 213 can be entangled. The theory for a RIP device can be better understood in view of the following expression, which assumes that assumes $\chi$ for each qubit is the same:

$$\dot{\theta}_{Z_iZ_j}^{s.s.} = -\frac{|\tilde{\varepsilon}_0|^2 \chi^2}{8\Delta(\Delta + 2\chi)(\Delta + 4\chi)} \quad \text{(Eq. 7)}$$

Where:

$\Delta = \omega_d - \omega_r$;

$\dot{\theta}$ is the ZZ rotation rate (i.e., the frequency offset of a qubit that is dependent on the state of the other qubit); and $\tilde{\varepsilon}_0$ is a fixed drive amplitude.

Applicants have determined that two of these basic elements 206 can be combined to provide a multiplexed basic flux-tunable qubit element 208. The tunable qubit $Q_{tune}$ (e.g., 221 and/or 219) is a tunable ancilla. Variations in the RIP pulse frequency and/or the frequency of the fixed frequency qubit $Q_d$ (e.g., 209) can be compensated for with the tunable qubit $Q_{tune}$ (e.g., 221). Stated differently, the tunable qubit $Q_{tune}$ can be adjusted to calibrate the gate to the fixed RIP pulse 222.

In the proposed architecture of the multiplexed basic flux tunable element 208, the flux tunable qubit $Q_{tune}$ (e.g., 221 and/or 219) can be used to vary $\chi$ of equation 1 above by applying a flux pulse 222 on the ancilla qubit $Q_{tune}$ 221 and/or 219. This tunes the ancilla qubit $Q_{tune}$ (e.g., 221) to get a certain desired frequency difference between the two qubits. This sequence modifies ↔ of equation 1 above, and allows for the calibration of a fixed drive amplitude $\bar{\varepsilon}_0$. Accordingly, any variations in the signal propagating on the fixed driveline 230 (i.e., going to the first RIP resonator 216 and the second RIP resonator 218) can be adjusted by the corresponding tunable qubit $Q_{tune}$ 221 and/or $Q_{tune}$ 219. In this way, the amount of entanglement between a qubit (e.g., 209) and its corresponding tunable qubit (e.g., 221) can be controlled.

The multiplexed basic flux tunable element 208 is less susceptible to various types of disorders because of the flux-tunability of $Q_{tune}$. Example disorders mitigated by the multiplexed basic flux tunable element 208 include a disorder in the amplitude of the RIP drives $\bar{\varepsilon}_0$. Further, fabrication process that may lead to a disorder in the data qubit frequency $\omega_d$, as well as the RIP resonator frequency $\omega_r$, are mitigated by the teachings herein.

Example Expansion of Basic Elements

Figure 3:
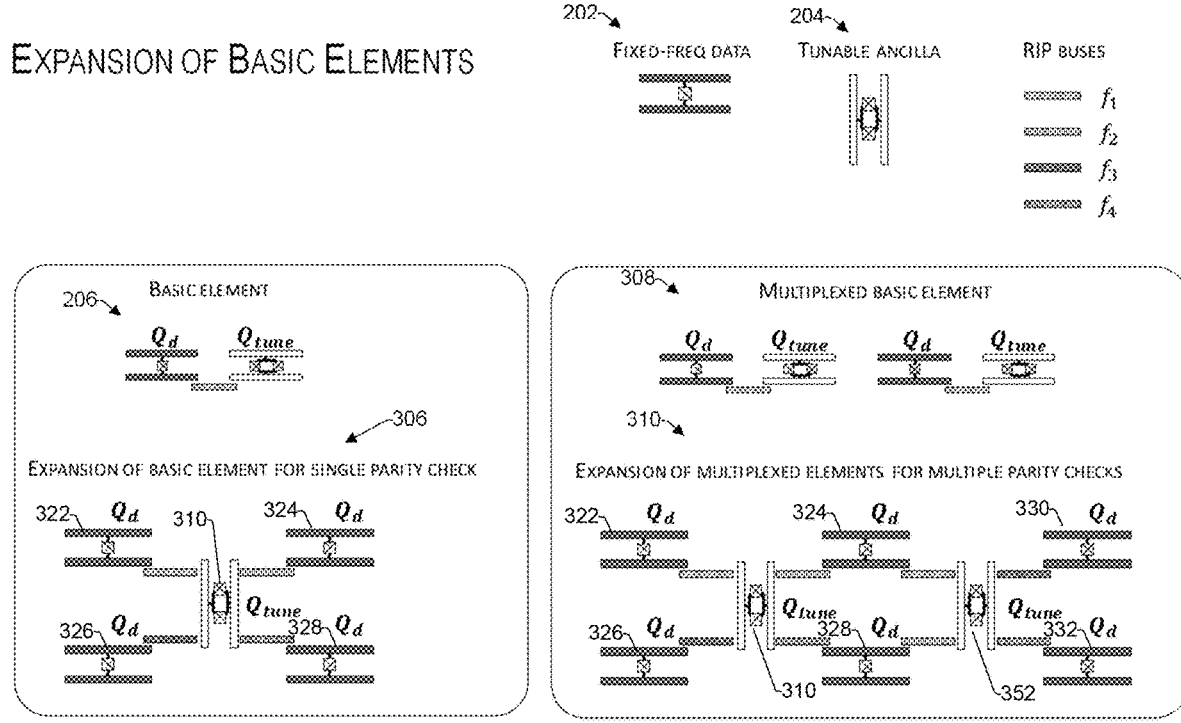
FIG. 3 provides an expansion of the basic elements of FIG. 2, consistent with an illustrative embodiment.

Reference now is made to FIG. 3, which provides an expansion of the basic elements of FIG. 2, consistent with an illustrative embodiment. A basic flux-tunable qubit element 206 and a multiplexed basic flux-tunable qubit element 308 are repeated in FIG. 3 as a reference to structures that are expanded thereon to provide multiplex capability. More particularly, FIG. 3 illustrates an example element for a single parity check 306 comprising a plurality of fixed qubits 322 to 328 coupled to a common tunable qubit 310. In structure 306, each fixed frequency qubit (e.g., 322 to 328) is coupled to the tunable qubit 310 via a RIP bus (sometimes referred to herein as a coupling resonator) having a different frequency (e.g., $f_1$ to $f_4$). For example, qubit $Q_d$ 322 is coupled to a RIP bus having a first frequency $f_1$, qubit $Q_d$ 324 is coupled to a RIP bus having a second frequency $f_2$, qubit $Q_d$ 326 is coupled to a RIP bus having a third frequency $f_3$; and qubit $Q_d$ 328 is coupled to a RIP bus having a fourth frequency $f_4$. In one embodiment, the difference between the frequencies of the RIP busses $f_1$ to $f_4$ is 100 Mhz or more.

The tunable qubit 310 can be sequentially adjusted to perform a gate with qubit $Q_d$. 322, then re-tuned to perform a gate with qubit $Q_d$. 324, then re-tuned to perform a gate with the qubit $Q_d$. 328, and so on. While four fixed frequency qubit devices have been shown by way of example in the basic element 306, it will be understood that any number of fixed frequency qubits can be coupled to a tunable qubit $Q_{tune}$, each having a RIP bus of a different frequency. The basic element for a single parity check 306 can be expanded for multiple parity checks while maintaining a fixed number of RIP buses. In this regard, FIG. 3 illustrates an expansion of multiplexed elements for multiple parity checks 310, where additional fixed frequency qubits $Q_d$ 330 and $Q_d$ 332 are included in the array via shared $Q_{tune}$ 352. Fixed frequency qubits $Q_d$ 324 and $Q_d$ 328 are both shared (e.g., accessible) by both tunable qubits $Q_{tune}$ 310 and $Q_{tune}$ 352. Accordingly, multiple qubits having a same qubit frequency can be accessed concurrently. For example, the qubits coupled to RIP busses having a first frequency $f_1$ could all be accessed at a same time, as they share the same RF line, thereby substantially reducing a number of wires used in the refrigerated environment. For simplicity and to avoid clutter, a lattice of six fixed qubits $Q_d$ and two tunable qubits $Q_{tune}$ have been shown in structure 310. It will be understood that any size lattice is supported by the teachings herein.

Example Graphs

Figure 4A:
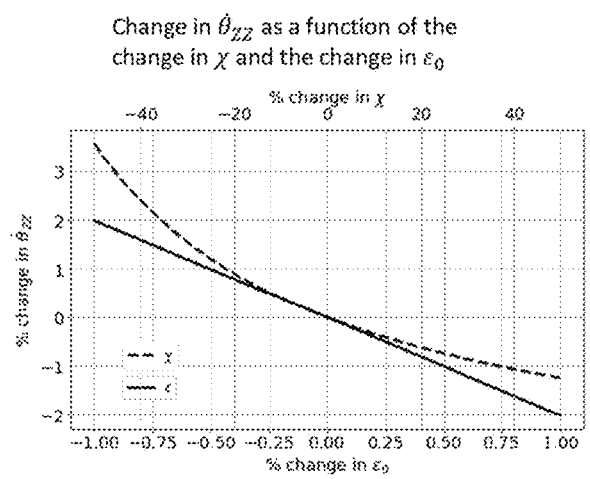
FIG. 4A illustrates a change in $\theta_{ZZ}$ as a function of the change in $\chi$ and a change in $\varepsilon_0$, respectively.
Figure 4B:
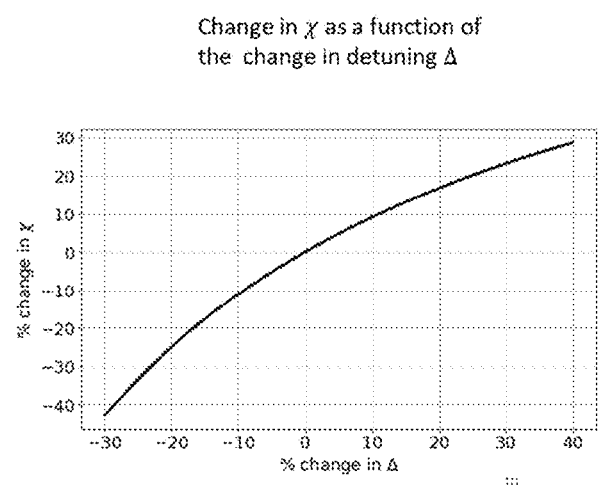
FIG. 4B illustrates a change in $\chi$ as a function of the change in detuning $\Delta$.

As discussed above, the teachings herein can mitigate various disorders. To that end, FIGS. 4A and 4B illustrate how a 1% change in the RIP pulse amplitude can be compensated for by a 40% change in chi. If the control lines going to each RIP resonator had slightly different transmission properties, then each resonator would experience a different amplitude electric field. More specifically, FIG. 4A illustrates a change in $\theta_{ZZ}$ as a function of the change in $\chi$ and a change in $\varepsilon_0$, respectively. The frequency of the RIP resonator depends on the quantum states the ancilla and the data qubit. If both qubits are in a ground state, then the frequency of the RIP resonator will not shift. If one, or both qubits are in the excited state, the RIP resonator frequency will shift by $\chi$. The magnitude of the $\chi$ shift depends on the frequency different between the ancilla qubit and the RIP resonator.

FIG. 4B illustrates a change in as a function of the change in detuning $\Delta$. For example, the detuning is changed by 30%. For example, the flux tunable qubit is being detuned from the frequency of the RIP resonator. The change is in reference to the detuning (i.e., a change in frequency). Accordingly, FIGS. 4A and 4B provide a working range.

Figure 5:
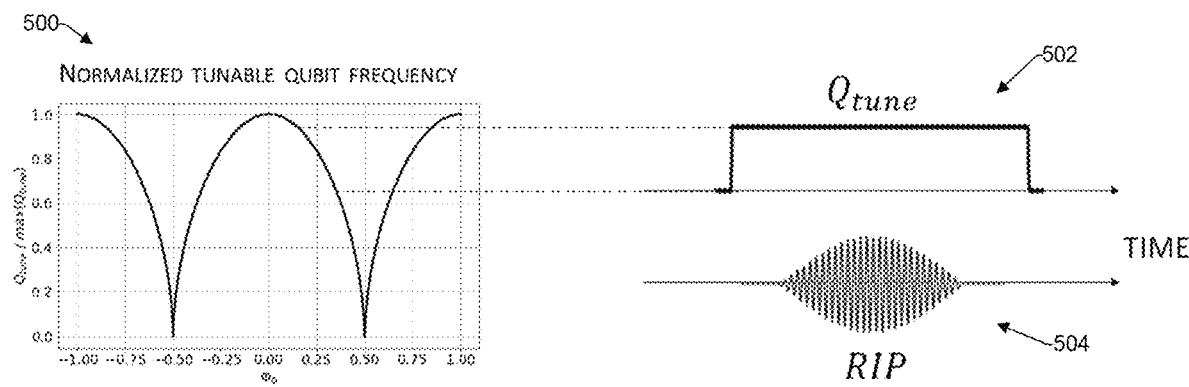
FIG. 5 provides a conceptual diagram explaining how a qubit is tuned, consistent with an illustrative embodiment.

FIG. 5 provides a conceptual diagram explaining how a qubit is tuned, consistent with an illustrative embodiment. More particularly, graph 500 illustrates a normalized tunable qubit frequency. There is a RIP pulse 504 that is applied during a tuning phase of a tunable qubit 502 that compensates for the disorders discussed herein, including disorders from qubit frequencies, resonator, amplitude of the pulse when split, etc. The RIP pulse is applied to perform a two-qubit gate (e.g., entangling the fixed frequency qubit with a tunable qubit (e.g., ancilla). Regarding waveform 502, it illustrates the change in frequency of the qubit over time. While the qubit is tuned to the higher frequency, there is a window that we can apply the RIP pulse shown in 504 to generate entanglement. The change in frequency of the qubit displayed in waveform 502 may be achieved in practice by applying a flux to the tunable qubit. Accordingly, the dashed lines between 502 and 500 illustrate that these changes in frequency are connected to changes in flux.

Additional Embodiment

Figure 6A:
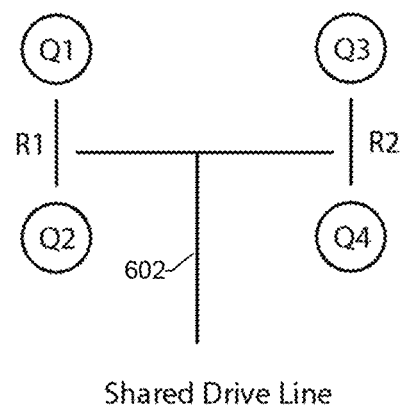
FIGS. 6A and 6B provide diagrams related to using RIP frequency as a knob to multiplex access to multiple qubits, consistent with an illustrative embodiment.
Figure 6B:
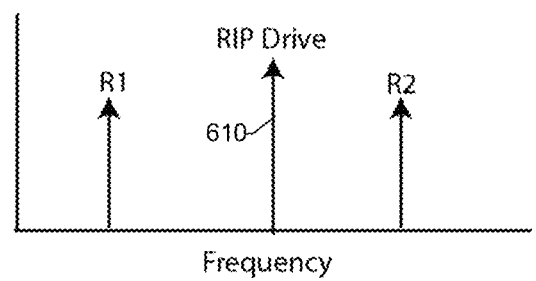

FIGS. 6A and 6B provide diagrams related to using RIP frequency as a knob to multiplex access to multiple qubits, consistent with an illustrative embodiment. Two different RIP resonant buses (i.e., R1 and R2) in FIG. 6A that connect qubits Q1 to Q4, respectively, are driven using a shared driveline 602. FIG. 6B illustrates that the RIP resonators R1 and R2 are deliberately detuned from each other. In this way, we can drive in between the two resonators 610. Stated differently, a two-qubit gate can be applied between Q1-Q2 concurrently with Q3-Q4. In this way, an RF pulse can be applied to both RIP resonators concurrently that are between the frequencies of the two resonators, thereby expediting phase accumulation.

Figure 7:
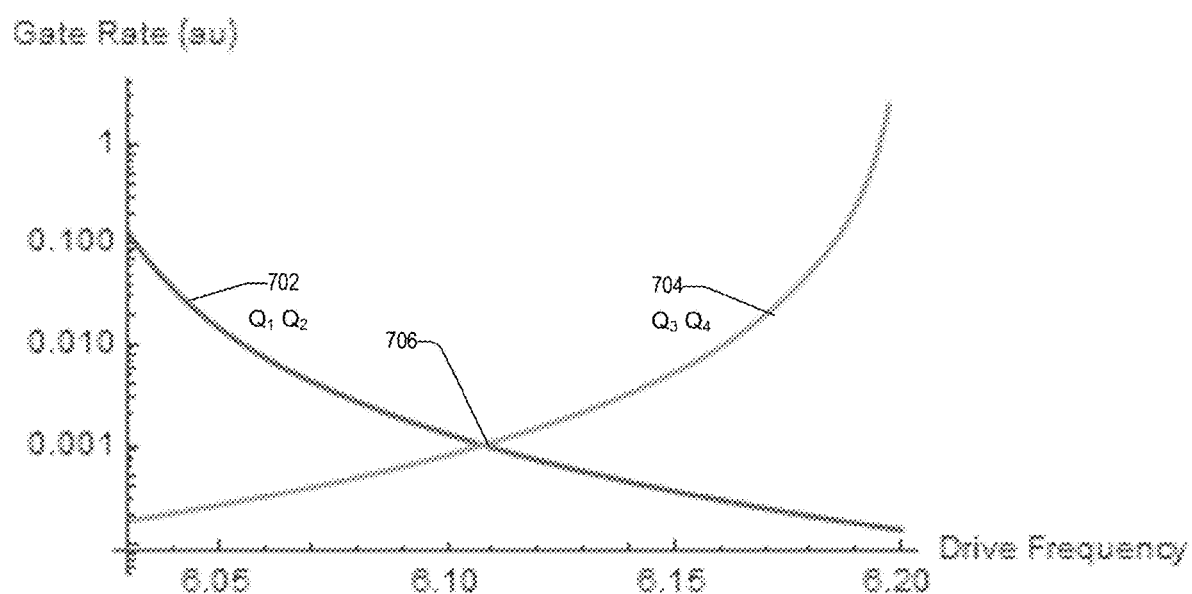
FIG. 7 illustrates a gate rate vs. drive frequency of the example of FIG. 6A, consistent with an illustrative embodiment.

This concept may be better understood in view of FIG. 7, which illustrates a gate rate vs. drive frequency of the example of FIG. 6A, consistent with an illustrative embodiment. Curve 702 represents qubits Q1 and Q2 of FIG. 6A, whereas curve 704 represents qubits Q3 and Q4 of FIG. 6A. For example, curve 702 represents the gate rate, or rate of entanglement generation, between qubits Q1 and Q2, and curve 704 represents the gate rate between qubits Q3 and Q4 as a function of the frequency of the RIP drive applied concurrently to R1 and R2. Since the gate rate falls off with the detuning, we can move the drive frequency and find a place where the gate rate for Q1, Q2 is the same as Q3, Q4, represented by point 706 at approximately 7.11 GHz in FIG. 7.

As illustrated, the ZZ rate as function of drive frequency is plotted 704 for R1 at 6 GHz and R2 at 6.2 GHz. Near 6.11 GHz, gate speeds on R1 and R2 are equal. Accordingly, the two gates can be driven in parallel. It should be noted that in scenarios where we want to only do a gate on Q1 and Q2 (but not Q3 and Q4) we can split the gate into two parts and use an echo sequence to remove the ZZ accumulation on Q3 and Q4. As mentioned previously, ZZ represents a state dependent qubit interaction that can be used to form a $C_{phasegate}$. It should be noted that, as used herein, the terms ZZ rate, gate rate, or rate of entanglement generation are all interchangeable. The 2-qubit operation we are trying to achieve happens over a period of time. The inverse of the time to complete the operation is the 'rate' of the operation.

Example Embodiments

Figure 8:
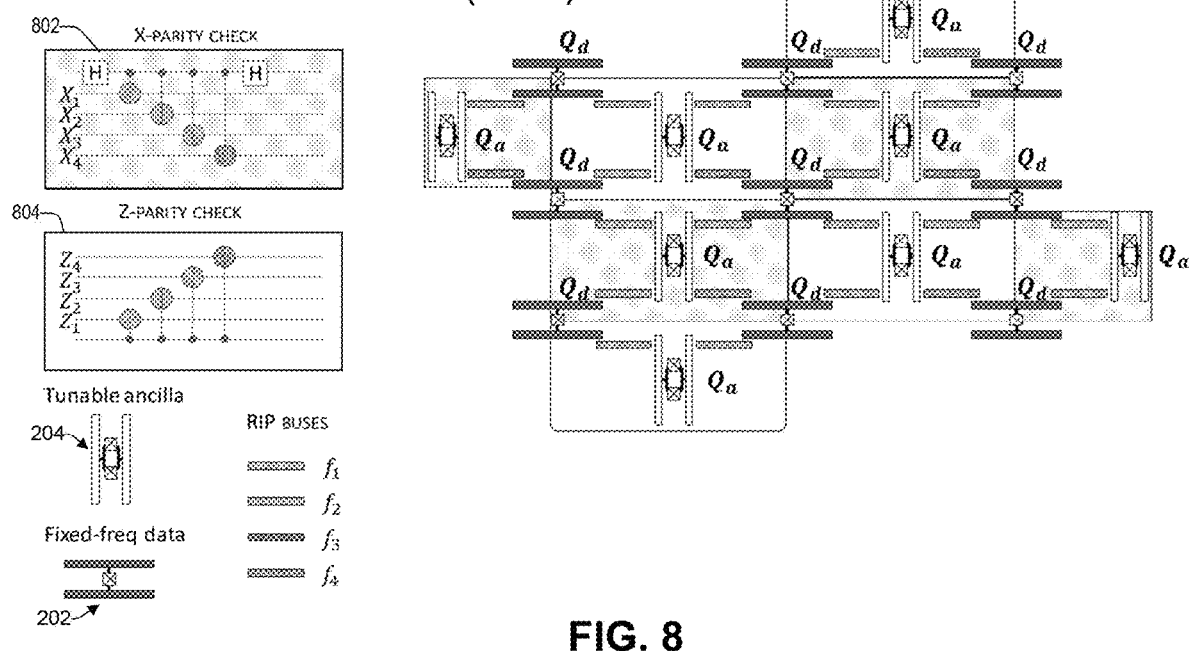
FIG. 8 provides an overview of an example architecture having 17 qubits, where eight are tunable qubits and nine are fixed, consistent with an illustrative embodiment.
Figure 9:
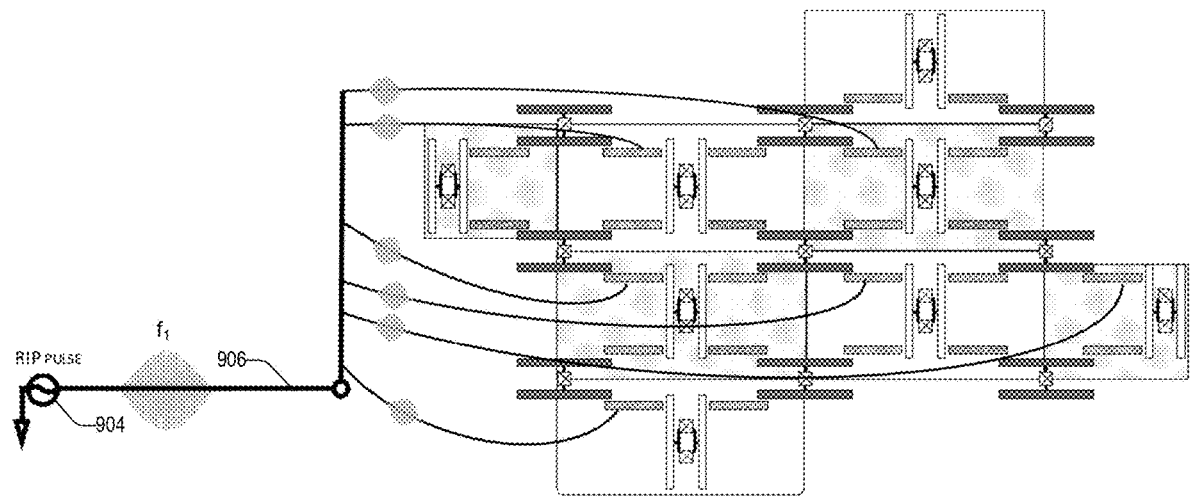
FIG. 9 illustrates a multiplexed RIP bus driving a first entangling gate, consistent with an illustrative embodiment.
Figure 10:
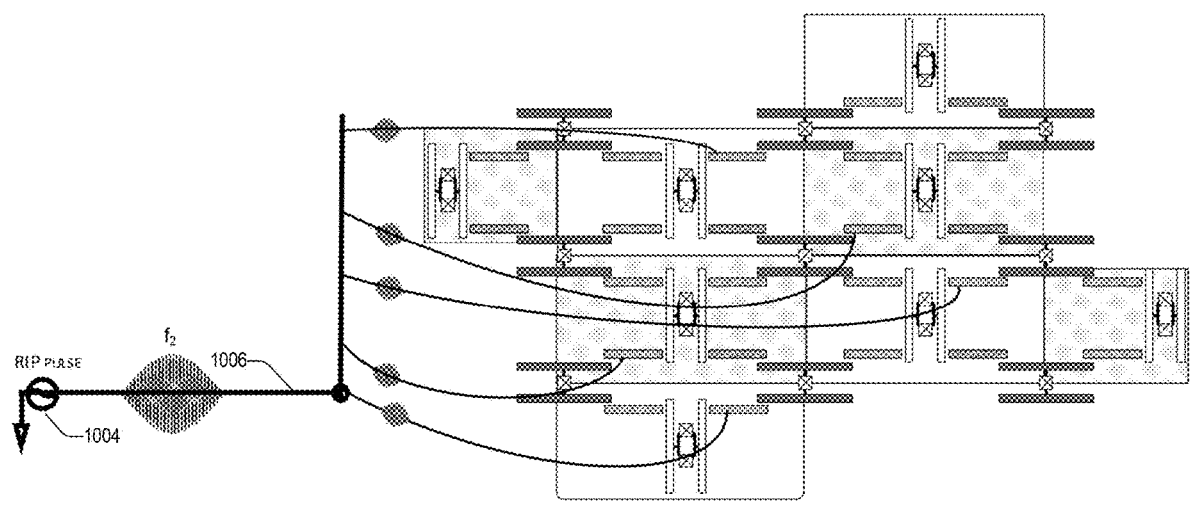
FIG. 10 illustrates a multiplexed RIP bus driving a second entangling gate, consistent with an illustrative embodiment.
Figure 11:
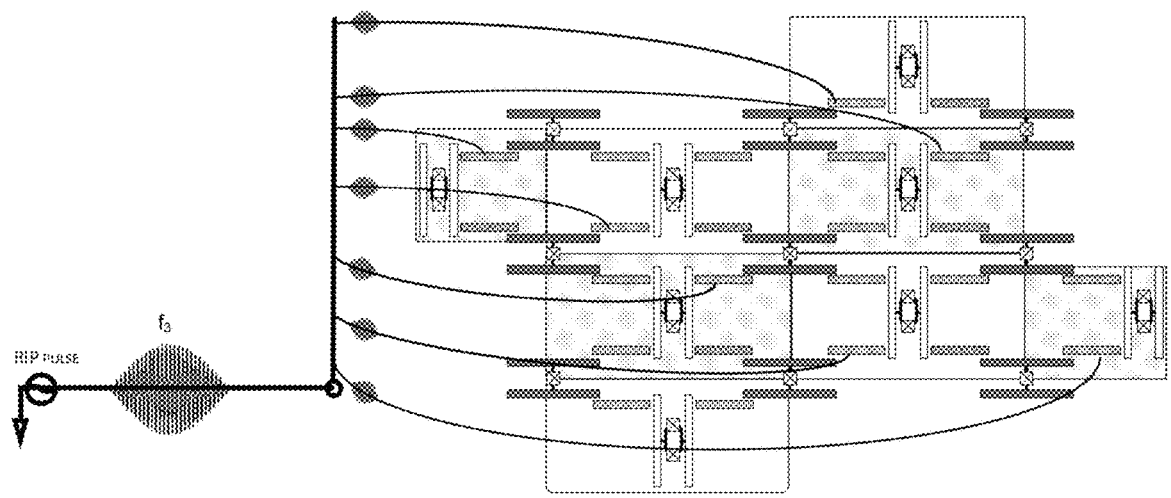
FIG. 11 illustrates a multiplexed RIP bus driving a third entangling gate, consistent with an illustrative embodiment.
Figure 12:
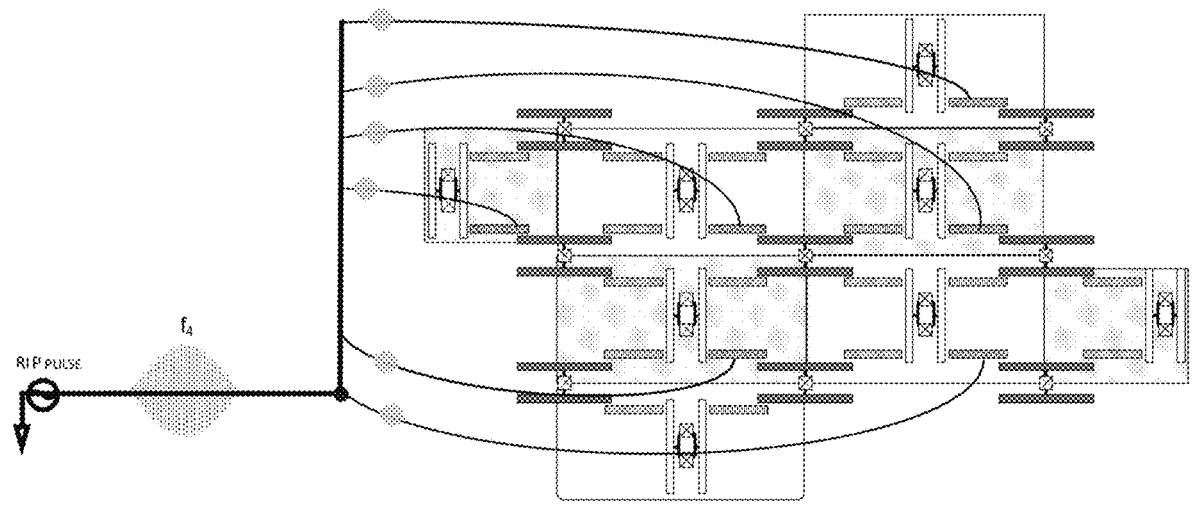
FIG. 12 illustrates a multiplexed RIP bus driving a fourth entangling gate, consistent with an illustrative embodiment.

FIG. 8 provides an overview of an example architecture having 17 qubits, where eight are tunable qubits (represented by qubits annotated with Qa) and nine are fixed qubits (represented by qubits annotated with $Q_d$), consistent with an illustrative embodiment. In one embodiment, the architecture of FIG. 8 can be used in the context of a surface code type device where X and Z parity checks 802 and 804 are performed. For example, the X-parity check 802 checks the phase, whereas the Z-parity check 804 checks the state (e.g., up or down).

FIG. 8 illustrates an architecture supporting four separate RIP busses $f_1$ to $f_4$. All RIP busses having a same frequency can be driven concurrently during an error correction cycle. To that end, FIGS. 9 to 12 illustrate different RIP busses being activated at different stages (e.g., time periods) during a parity check. More particularly, FIGS. 9 to 12 illustrate a multiplexed RIP bus driving a first, second, third, and fourth entangling gate, respectively, consistent with an illustrative embodiment. For example, referring to FIG. 9, when a RIP pulse 904 of a first frequency $f_1$ is generated on fixed drive-line 906, all RIP buses having a same frequency $f_1$ can be driven concurrently during an error correcting cycle. Similarly, in FIG. 10, when an RIP pulse 1004 of a second frequency $f_2$ is generated on a separate fixed drive-line 1006, all RIP buses having a same frequency $f_2$ can be driven concurrently during an error correcting cycle. The operation of the multiplexed RIP bus of FIGS. 11 and 12, driving a third entangling gate and a fourth entangling gate, respectively, is substantially similar to that of FIGS. 9 and 10, and therefore not repeated here for brevity. In one embodiment, the operation depicted in FIGS. 9 to 12 can be run repeatedly in a cycle in the context of performing X and Z parity checks.

Example Power Splitters

Figure 13A:
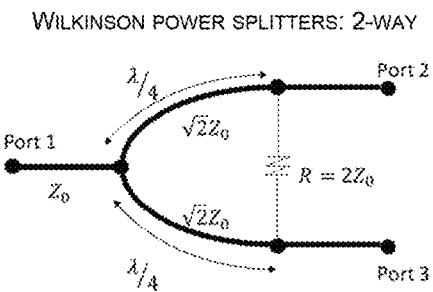
FIGS. 13A to 13D provide different ways of performing power splitting a qubit control signal, consistent with illustrative embodiments.
Figure 13B:
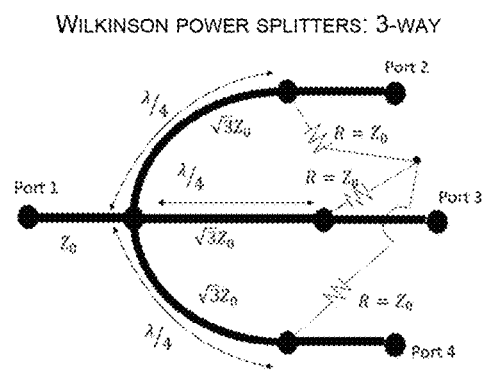
Figure 13C:
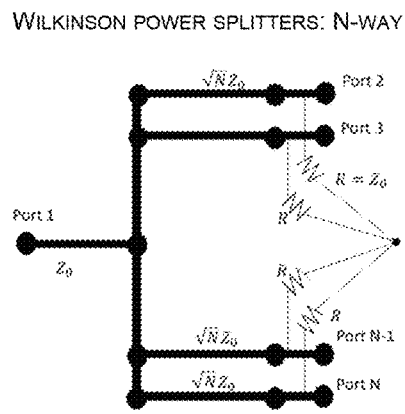
Figure 13D:
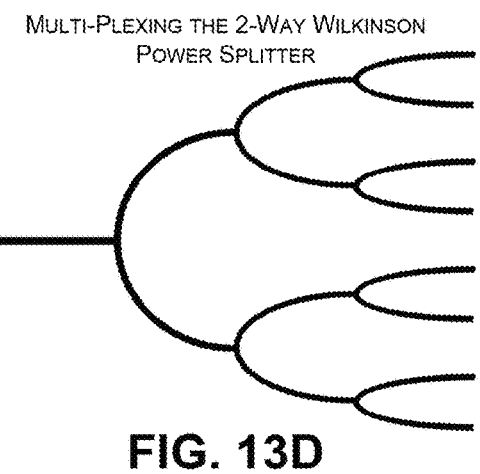

As discussed above, functions relating to multiplexing RIP drive signals involve splitting of a qubit control signal into two or more paths. To that end, FIGS. 13A to 13D provide different ways of performing power splitting that can be used to split a qubit control signal. More specifically, FIG. 13A illustrates a 2-way Wilkinson power splitter; FIG. 13B illustrates a 3-way Wilkinson power splitter; and FIG. 13C illustrates an N-way Wilkinson power splitter. In some embodiments, the power is not split immediately in a first stage but split in progressive stages, as illustrated in FIG. 13D.

Example Process

Figure 14:
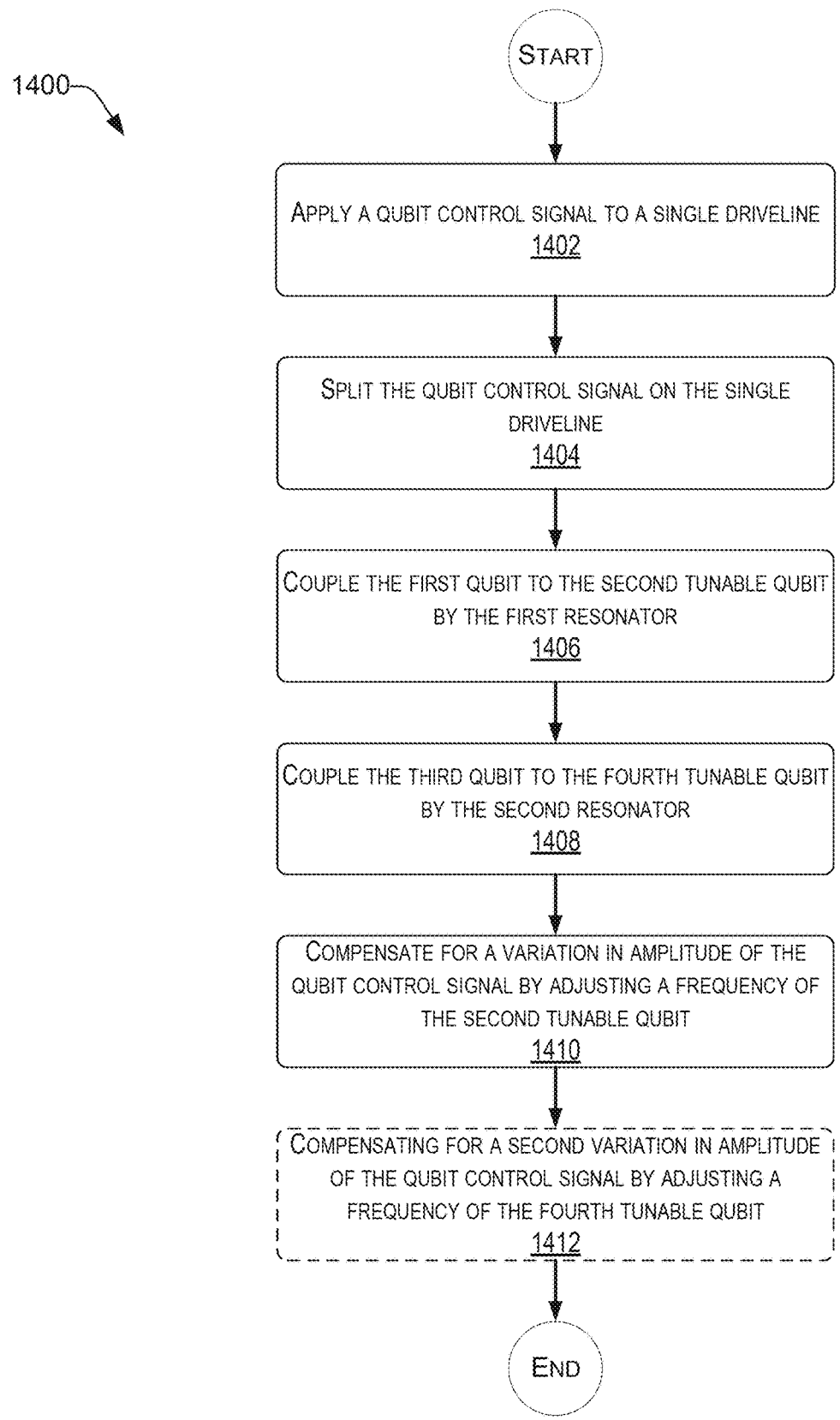
FIG. 14 presents an illustrative process related to reading out signals from a quantum processor, consistent with an illustrative embodiment.

With the foregoing overview of the example architectures, it may be helpful now to consider a high-level discussion of an example process. To that end, FIG. 14 presents an illustrative process related to reading out signals from a quantum processor. Processes 1400 is illustrated as a collection of blocks, in a logical flowchart, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform functions or implement abstract data types. In each process, the order in which the operations are described is not intended to be construed as a limitation, and any number of the described blocks can be combined in any order and/or performed in parallel to implement the process. For discussion purposes, the process is described with reference to the architecture of the multiplexed basic element 208 of FIG. 2.

At block 1402, a qubit control signal 222 is applied to a single driveline 223.

At block 1404, the qubit control signal on the single driveline is split between a first resonator 216 and a second resonator 218, wherein the single driveline 223 is operative to control a first qubit 209, a second tunable qubit 211, a third qubit 217, and a fourth tunable qubit 219.

At block 1406, the first qubit 209 is coupled to the second tunable qubit 211 by the first resonator 216.

At block 1408, the third qubit 217 is coupled to the fourth tunable qubit 219 by the second resonator 218; and At block 1410, a variation in amplitude of the qubit control signal is compensated by adjusting a frequency of the second tunable qubit 211.

In one embodiment, at block 1412, further compensation is provided for a variation in amplitude of the qubit control signal by adjusting a frequency of the fourth tunable qubit 219.

In some embodiments, the flow of process 1400 may be repeated cyclically.

Example Computer Platform

Figure 15:
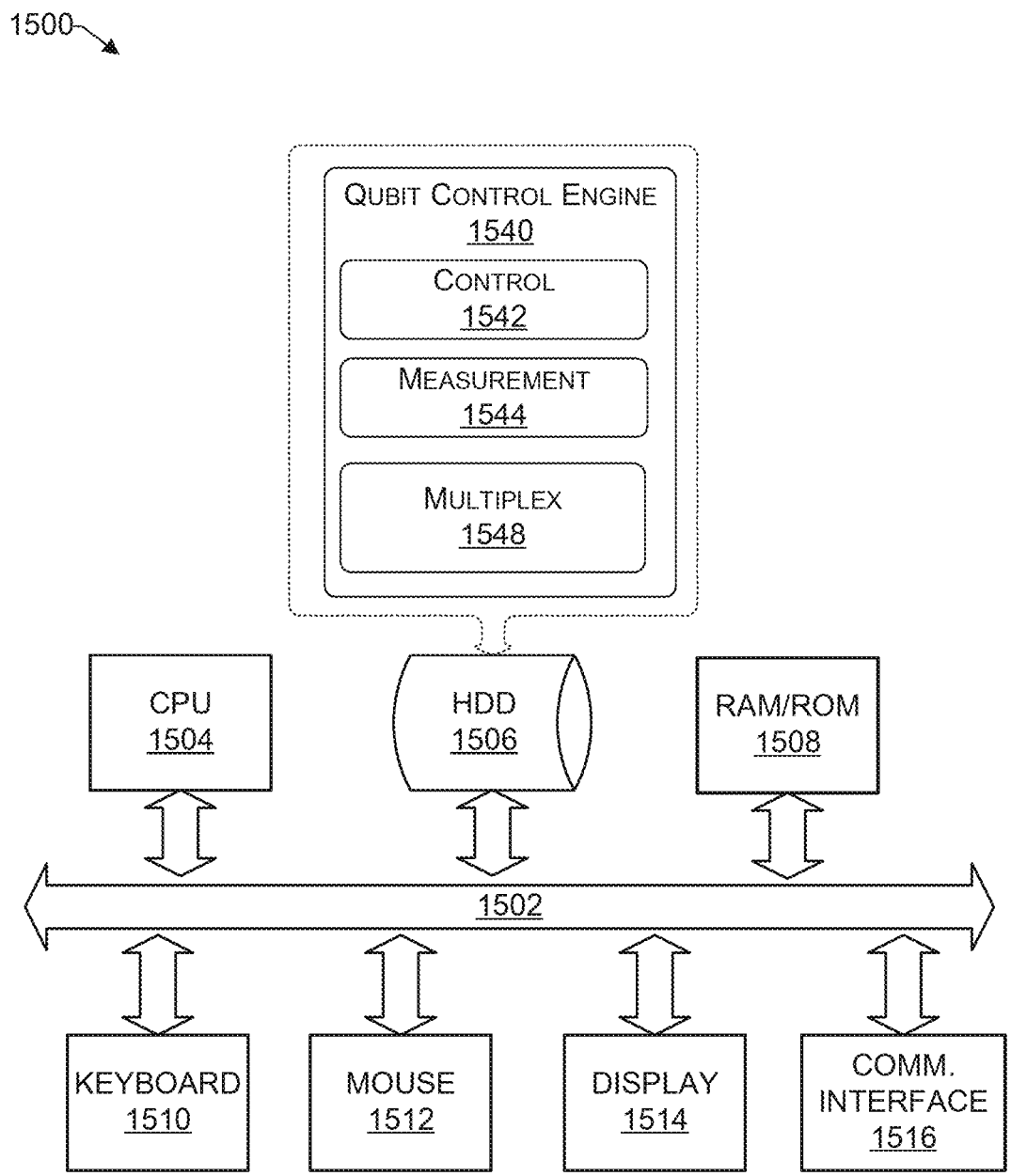
FIG. 15 provides a functional block diagram illustration of a computer hardware platform that can be used to implement a particularly configured computing device that can host a qubit control engine, consistent with an illustrative embodiment.

As discussed above, functions relating to interacting with qubits by way of measurement and control signals may include a measurement and control unit, as shown in FIG. 1A. FIG. 15 provides a functional block diagram illustration of a computer hardware platform 1500 that can be used to implement a particularly configured computing device that can host a qubit control engine 1540. In particular, FIG. 15 illustrates a network or host computer platform 1500, as may be used to implement an appropriately configured computing device, such as the measurement and control block 130 of FIG. 1.

The computer platform 1500 may include a central processing unit (CPU) 1504, a hard disk drive (HDD) 1506, random access memory (RAM) and/or read only memory (ROM) 1508, a keyboard 1510, a mouse 1512, a display 1514, and a communication interface 1516, which are connected to a system bus 1502.

In one embodiment, the HDD 1506, has capabilities that include storing a program that can execute various processes, such as the qubit control engine 1540, in a manner described herein. The qubit control engine 1540 may have various modules configured to perform different functions. For example, there may be a control module 1542 that is operative to send control signals to the qubit. There may be a measurement module 1544 operative to perform functions to receive feedback from the qubits discussed herein. There may be a multiplex module 1548 that is configured to provide the multiplex control signals discussed herein.

In one embodiment, a program, such as Apache™, can be stored for operating the system as a Web server. In one embodiment, the HDD 1506 can store an executing application that includes one or more library software modules, such as those for the Java™ Runtime Environment program for realizing a JVM (Java™ virtual machine).

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to a flowchart illustration and/or block diagram of a method, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of an appropriately configured computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The call-flow, flowchart, and block diagrams in the figures herein illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method of multiplexing control lines of a qubit array, comprising:
    applying a qubit control signal to a single driveline;
    splitting the qubit control signal on the single driveline between a first resonator and a second resonator, wherein the single driveline is operative to control a first qubit, a second tunable qubit, a third qubit, and a fourth tunable qubit;
    coupling the first qubit to the second tunable qubit by the first resonator;
    coupling the third qubit to the fourth tunable qubit by the second resonator; and
    compensating for a variation in amplitude of the qubit control signal by adjusting a frequency of at least one of the second tunable qubit or the fourth tunable qubit.

2. The method of claim 1, wherein:
    the single driveline is configured to drive a resonator induced phase (RIP) gate;
    the first resonator is a RIP resonator; and
    the second resonator is a RIP resonator.

3. The method of claim 2, further comprising providing a calibration of the RIP gate between the first qubit and the second qubit by maximizing a fidelity of the gate while varying a RIP frequency.

4. The method of claim 2, wherein the second and fourth tunable qubits are flux-tunable Ancilla qubits operative to modify a frequency difference between the corresponding RIP resonator by changing a quantum state dependent frequency shift $\chi$ on the corresponding RIP resonator of the first and second RIP resonators.

5. The method of claim 4, wherein a magnitude of the frequency shift $\chi$ of the first qubit and second tunable qubit depends on a frequency difference between the second tunable qubit and the first qubit.

6. The method of claim 1, further comprising compensating for a second variation in amplitude of the qubit control signal by adjusting the frequency of the fourth tunable qubit.

7. The method of claim 1, wherein the qubit control signal is a radio frequency (RF) pulse having a fixed drive amplitude and a fixed frequency.

8. The method of claim 1, wherein the splitting is performed by a resistive power splitter, a reactive power splitter, or a multi-port coupler.

9. The method of claim 1, wherein the splitting is performed by a Wilkinson resistive power splitter, a Wye power splitter, or a Delta power splitter.

10. The method of claim 1, further comprising performing error correction for a surface code architecture by cyclically performing at least one of X-parity and Z-parity.

11. The method of claim 1, further comprising:
    detuning the first resonator from the second resonator; and
    moving a drive frequency of the qubit control signal to a frequency where a gate rate for the first qubit and the second tunable qubit is same as a gate rate for the third qubit and the tunable fourth qubit.

12. A quantum structure comprising:
    a first qubit;
    a second tunable qubit coupled to the first qubit via a first resonator;
    a third qubit;
    a fourth tunable qubit coupled to the third qubit via a second resonator; and
    a fixed driveline coupled to the first resonator and the second resonator, wherein the second tunable qubit is configured to be adjusted to compensate for a variation in amplitude of a qubit control signal of the fixed driveline.

13. The quantum structure of claim 12, wherein:
    the fixed driveline carries signals to a resonator to drive a resonator induced phase (RIP) gate;
    the first resonator is a RIP resonator; and
    the second resonator is a RIP resonator.

14. The quantum structure of claim 13, wherein the second and fourth tunable qubits are flux-tunable Ancilla qubits configured to modify a quantum state dependent frequency shift $\chi$ of its corresponding RIP resonator.

15. The quantum structure of claim 14, wherein a modification of $\chi$ of at least one of the first or third resonators is operative to mitigate a disorder in a pulse amplitude of the qubit control signal.

16. The quantum structure of claim 12, wherein an adjustment of a frequency of the fourth tunable qubit is operative to compensate for a second variation in amplitude of the qubit control signal.

17. The quantum structure of claim 12, wherein the qubit control signal is a radio frequency (RF) pulse having a fixed drive amplitude and a fixed frequency.

18. The quantum structure of claim 12, wherein the splitting is performed by a resistive power splitter, a reactive power splitter, or a multi-port coupler.

19. The quantum structure of claim 12, further comprising an RF splitter configured to split a qubit control signal on the fixed single driveline.

20. A quantum structure comprising:
    a first qubit;
    a second tunable qubit coupled to the first qubit via a first resonator;
    a third qubit;
    a fourth tunable qubit coupled to the third qubit via a second resonator; and
    a shared driveline coupled to the first resonator and the second resonator, wherein:
    the first resonator is detuned from the second resonator; and
    a drive frequency of a qubit control signal is at a frequency where a gate rate for the first qubit and the second tunable qubit is same as a gate rate for the third qubit and the tunable fourth qubit.

* * * * *